United States Patent
Jeong

(10) Patent No.: US 6,717,880 B2
(45) Date of Patent: Apr. 6, 2004

(54) CURRENT REDUCING DEVICE IN SENSE AMPLIFIER OVER DRIVER SCHEME OF SEMICONDUCTOR MEMORY CHIPS AND ITS METHOD

(75) Inventor: Bong-Hwa Jeong, Kyoungki-do (KR)

(73) Assignee: Hynix Semiconductor Inc, Kyoungki-Do (KR)

(*) Notice: Subject to any disclaimer, the term of this patent is extended or adjusted under 35 U.S.C. 154(b) by 9 days.

(21) Appl. No.: 10/234,903

(22) Filed: Sep. 4, 2002

(65) Prior Publication Data
US 2003/0117863 A1 Jun. 26, 2003

(30) Foreign Application Priority Data

Dec. 24, 2001 (KR) .......................................... 2001-83954

(51) Int. Cl.$^7$ ................................................. G11C 7/00
(52) U.S. Cl. ..................... 365/227; 365/210; 365/226; 365/189.09; 327/541
(58) Field of Search ..................... 365/227, 226, 365/210, 189.07, 189.09, 204, 185.21; 327/540, 541, 535, 536

(56) References Cited

U.S. PATENT DOCUMENTS

| | | | |
|---|---|---|---|
| 5,258,956 A | 11/1993 | Ahn et al. | |
| 5,297,097 A | * 3/1994 | Etoh et al. | ................... 365/226 |
| 5,640,350 A | 6/1997 | Iga | |
| 5,703,821 A | 12/1997 | Baroni et al. | |
| 5,729,493 A | 3/1998 | Morton | |
| 5,825,702 A | 10/1998 | Noda | |
| 5,909,402 A | 6/1999 | Joo | |
| 6,058,061 A | 5/2000 | Ooishi | |
| 6,144,603 A | 11/2000 | Makino | |
| 6,201,437 B1 | * 3/2001 | Kono et al. | ................... 327/545 |
| RE37,593 E | * 3/2002 | Etoh et al. | ............. 365/189.09 |

FOREIGN PATENT DOCUMENTS

| | | |
|---|---|---|
| JP | 55-070990 | 5/1980 |
| JP | 58-062892 | 4/1983 |
| JP | 60-063791 | 4/1985 |
| JP | 03-192594 | 8/1991 |
| JP | 08-249885 | 9/1996 |
| JP | 10-302467 | 11/1998 |
| JP | 11-066840 | 3/1999 |
| JP | 2000-266563 | 9/2000 |

* cited by examiner

Primary Examiner—Gene Auduong
(74) Attorney, Agent, or Firm—Marshall, Gerstein & Borun LLP

(57) ABSTRACT

A current reducing device is provided in a sense amplifier over driver scheme of a semiconductor memory chip. The device can reduce the amount of the electric current consumed unnecessarily during the discharging operation by differing the reference voltages of a cell power voltage discharge unit and a cell power voltage generation unit during a portion of a discharging period.

25 Claims, 9 Drawing Sheets

CURRENT REDUCING DEVICE IN SENSE AMPLIFIER OVER DRIVER SCHEME OF SEMICONDUCTOR MEMORY CHIPS AND ITS METHOD

BACKGROUND

1. Field of the Invention

The present invention relates to a sense amplifier of a semiconductor memory chip and, more particularly, to reducing the consumption of an electric current caused by a simultaneous driving of two circuits by differing the reference voltages of a discharge voltage and a power generation circuit in a part of a discharging period, when reducing the power voltage that has been raised after over-driving a sense amplifier.

2. Description of Related Art

As semiconductors become more integrated and low powered, achievement of simultaneous low driving voltages and high speed becomes desirable. Accordingly, as a driving voltage is lowered, methods have been attempted to drive a sense amplifier smoothly in a dynamic RAM (DRAM), such as through a sense amplifier over driving method.

If the data stored in a cell are selected according to the operation of a bit line sense amplifier (to be referred to as a 'sense amplifier' hereinafter), they are charge-shared and come in as bit lines having the potential of the voltage for bit line precharge (VBLP). Here, in the pull-up operation from a bit line precharge voltage VBLP to a cell power voltage DVDD, since the cell power voltage CVDD is low and, thus, the difference between the cell power voltage CVDD and the voltage for bit line precharge (VBLP) is not large, it takes a long time to raise the VBLP to the desired level of the cell power voltage CVDD. To solve this problem, the size of a transistor for pull-up in the sense amplifier may be made larger, but this approach increases the size of a semiconductor memory chip, and often there are limitations imposed on the size of a particular memory chip. Therefore, an alternative solution has been to utilize an over driving method.

Referring to FIGS. 1 and 2, the operation of a conventional over-driving method will be described hereinafter.

The cell data selected by a word line are transferred to a bit line and the bit line pair is diverged. Here, the bit lines are diverged by the width of $\Delta V$, and the width is determined by the ratio of the cell capacitance and the bit line capacitance. The width may range from tens of millivolts to hundreds of millivolts. The sense amplifier is driven by the diverged width and creates a value sufficient to read/write data. The next operation begins during this operation of sense amplifier.

In a first over-driving period of the sense amplifier operation, a first sense amplifier enable signal SA_EN_1 is supplied to a MOS transistor MOS1 of an external power voltage unit 110 (in case of an NMOS transistor, an "H" or HIGH signal; and in the case of a PMOS transistor, an "L" or low signal) thereby enabling the MOS transistor MOS1. In the initial period, an external power voltage VEXT, which is higher than a cell power voltage CVDD, is supplied to the sense amplifier 130 through the path A along the MOS1 and the restore line RTO and thus the potential of the restore line RTO rises sharply.

When the potential of the restore line RTO rises to a predetermined level and the over-driving period has been finished, in a second driving period, a second sense amplifier enable signal SA_EN_2 is supplied to a MOS transistor MOS2 of the cell power voltage unit 120 thereby enabling the MOS transistor MOS2. At that moment, the cell power voltage CVDD is applied to the sense amplifier 130 through the MOS transistor MOS2 and the restore line RTO and place the sense amplifier 130 into a pull-up state and maintains that state.

During the operation, a current may flow from the external power voltage unit 110, which supplies relatively high voltage to the cell power voltage unit 120 which provides a relatively low voltage, thus raising the cell power voltage CVDD. In particular, when the sense amplifier 130 is operated continuously, the influx into the cell power voltage unit 120 appears large. In the part A of FIG. 2, the restore line RTO ascends excessively, and the cell power voltage CVDD is raised as well by the effect therefrom. The use of an over-driving circuit, which operates the driving of the sense amplifier 130, which reads/writes data for high speed processes of a semiconductor memory chip, improves the performance of the memory core. However, there is a problem that the electric current consumed is excessive due to the potential gap between the two powers.

To solve this problem, a method is utilized that compares the actual cell power voltage CVDD and the reference cell power voltage VREF in the middle of or after the sense amplifier operates and conducts over-driving. If the actual cell power voltage CVDD is higher than the reference power voltage VREF, the actual cell power voltage CVDD is lowered to a desired level. However, due to the delay time in sensing between the circuit (i.e., a discharge circuit) which lowers the actual cell power voltage CVDD that has been raised and the CVDD power generation circuit that raises the reference cell power voltage VREF when the actual cell power voltage CVDD falls below the reference cell power voltage VREF, the level of the actual cell power voltage CVDD fluctuates during this operation and much electric current is consumed unnecessarily. This operation will be described more in detail, hereinafter.

FIG. 3 is a block diagram describing the structure of a semiconductor memory device in accordance with another conventional over-driving method.

As shown in FIG. 3, a semiconductor memory device of the conventional over-driving scheme includes a core unit 310 of a semiconductor memory chip using an external power voltage VEXT and the cell power voltage CVDD. A cell power voltage generation unit 320 is included for generating a cell power voltage CVDD used in the core unit 310 and a cell power voltage discharge unit 330 is included for lowering the potential of the cell power voltage CVDD that has been raised by the operation of the core unit 310.

First, in the over-driving period, the cell power voltage CVDD is raised according to over driving by the external power voltage VEXT, and in the first discharging period, a cell power voltage discharge unit 330 operates and compares the actual cell power voltage CVDD with the reference voltage VREF. As the actual cell power voltage CVDD is raised, the cell power voltage discharge unit 330 operates and pulls down the actual cell power voltage CVDD to the level of the reference voltage VREF. When the actual cell power voltage CVDD falls below the reference voltage VREF by discharging during the discharge period, the discharging operation is not immediately halted. This is due to a delay in the sensing caused by operation time of transistors within the cell power voltage discharge unit 330. Thus, the actual cell power voltage CVDD falls below the reference voltage. The actual cell power voltage CVDD is then raised due to the operation of the cell power voltage generation unit 320 via charging, but does not terminate when the actual cell power voltage CVDD reaches the reference voltage through charging due to sensing delay time caused by operation time of the transistors in the voltage generation unit 320, thereby overshooting the reference voltage. Hence, a current flows from the external power voltage VEXT to the cell power voltage CVDD, and from the cell power voltage CVDD to the source voltage VSS, respectively, owing to the repeated operations of the cell power voltage generation unit 320 and the cell power voltage discharge unit 330, causing a dampened oscillation as shown in FIG. 4. This current is consumed unnecessarily, and as the operation of a semiconductor memory chip gets faster, the amount of the current consumption increases drastically.

SUMMARY OF THE INVENTION

The present disclosure provides a current reducing device in a sense amplifier over driver scheme of a semiconductor memory chip that can reduce the amount of electric current consumed unnecessarily during the discharging operation by differing the reference voltages of a cell power voltage discharge unit and a cell power voltage generation unit during a portion of the discharging period.

According to an aspect of the presently disclosed device for use in an over driver scheme of a semiconductor memory chip, a core unit is provided including a sense amplifier of the semiconductor memory chip. Also included is a cell power voltage generation unit that is configured to use in external power voltage as a power source, wherein the cell power voltage generation unit is further configured to receive a cell power voltage, which is used as a power source for the core unit, and a first reference voltage. The cell power voltage generation unit is also configured to increase the cell power voltage when the cell power voltage is lower than the first referenced voltage. Also included is a reference voltage generation unit that is configured to output a second reference voltage different from the first reference voltage during a portion of a discharging period. A cell power voltage discharge unit is included and configured to receive and compare the second reference voltage outputted from the reference voltage generation unit and the cell power voltage. The cell power voltage discharge unit also reduces the cell power voltage when the cell power voltage is higher than the second referenced voltage.

According to another aspect of the present disclosure, a current reducing device in an over driver scheme of a semiconductor memory chip includes a core unit including a sense amplifier of the semiconductor memory chip. A cell power voltage generation unit that uses an external power voltage is a power source is configured to receive a cell power voltage, which is used as a power source for the core unit, and a first reference voltage. The cell power voltage generation unit increases the cell power voltage when the cell power voltage is lower than the first reference voltage. A comparative cell power voltage generation unit is included for use by the cell power voltage discharge unit. This unit is configured to receive a second reference voltage that is in proportion to the first reference voltage and the cell power voltage. The unit then outputs a comparative cell power voltage that is lower than a proportional cell power voltage, which is in proportion to the cell voltage by a predetermined voltage during a portion of a discharging period. Finally, a cell power voltage discharge unit is included and is configured to receive and compare the comparative cell power voltage and the second reference voltage during the discharging period and to reduce the cell power voltage when the comparative cell power voltage is higher than the second reference voltage.

According to an aspect of the presently disclosed method for reducing an electric current in a sense amplifier over driver scheme of a semiconductor memory chip, over driving is performed by an external power voltage. A second reference voltage is generated that is different from a first reference voltage inputted to a cell power voltage generation unit, which generates a cell power voltage during a portion of the discharging period. A cell power voltage that is increased by the overdriving is compared with the second reference voltage and the cell power voltage is reduced during the discharging period. The cell power voltage is raised when the cell power voltage is lower than the first reference voltage.

According to yet another aspect of the presently disclosed method for reducing electric current in a sense amplifier over driver scheme of a semiconductor chip, overdriving is performed using an external power voltage. A comparative power voltage is output that is lower than a proportional cell power voltage, which is in proportion with a cell power voltage, during a portion of a discharging period by a predetermined voltage. The comparative cell power voltage is compared with a first reference voltage and the cell power voltage is reduced, the cell power voltage having been raised by the overdriving. Finally, the cell power voltage is raised when the cell power voltage is lower than a second reference voltage that is in proportion to the first reference voltage.

DETAILED DESCRIPTION OF THE PREFERRED EMBODIMENTS

Figure 5:
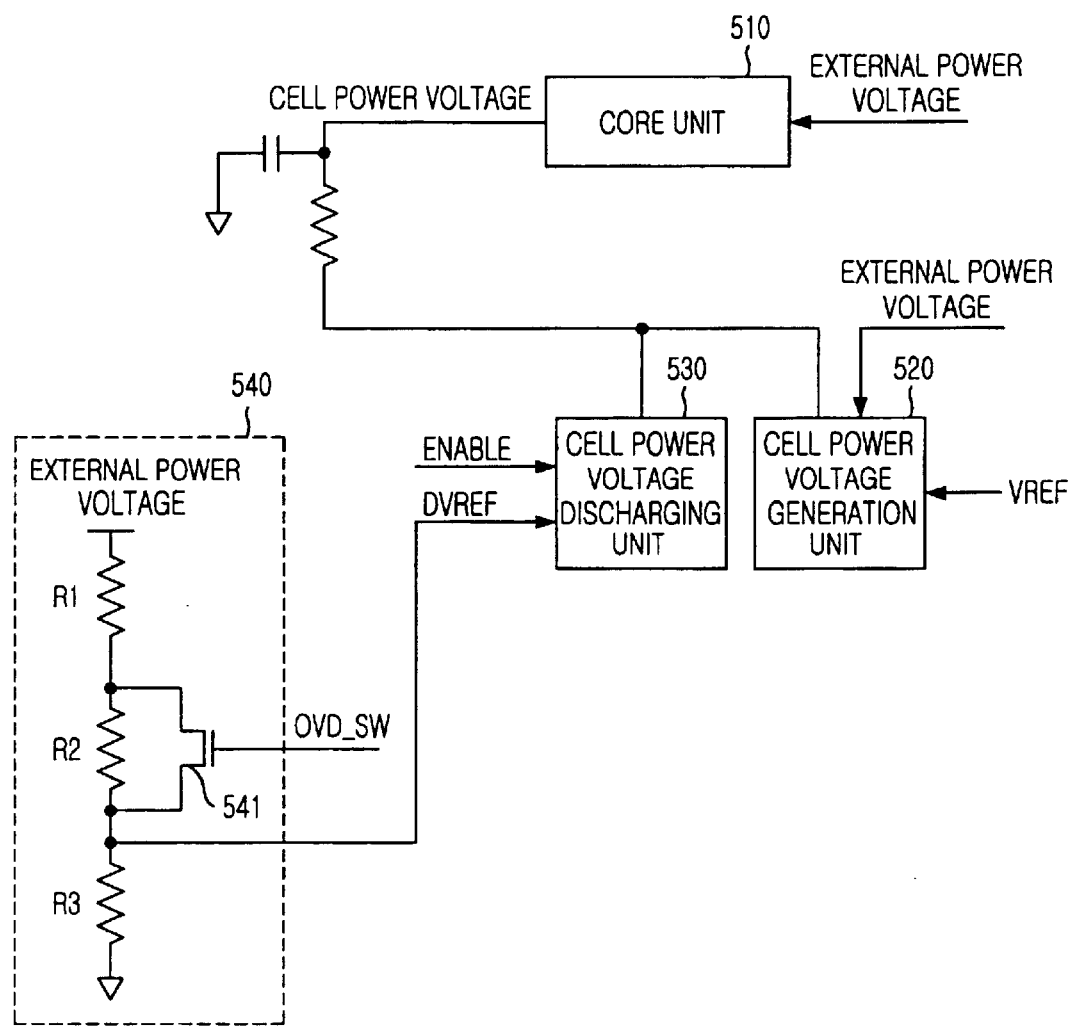
FIG. 5 is a block diagram illustrating the structure of the semiconductor memory device in accordance with an embodiment of the present disclosure.
Figure 6:
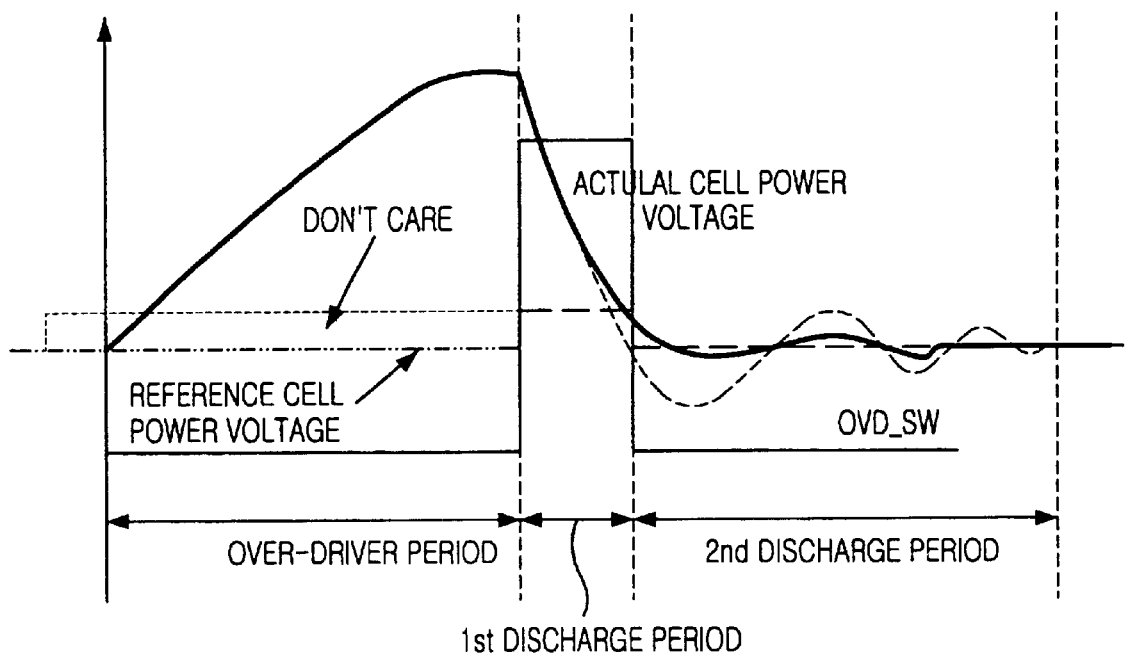
FIG. 6 is a waveform diagram of the semiconductor memory device of FIG. 5.

FIG. 5 is a block diagram illustrating the structure of the presently disclosed semiconductor memory device and FIG. 6 is a waveform diagram of the semiconductor memory device of FIG. 5.

As shown in FIG. 5, the semiconductor memory device includes a core unit 510 of a semiconductor memory chip using an external power voltage VEXT and the cell power voltage CVDD. A cell power voltage generation unit 520 is provided for generating a cell power voltage CVDD used as a power supply of the core unit 510. A cell power voltage discharge unit 530 is included for lowering the potential of the cell power voltage CVDD that has been raised by the operation of the core unit 510. Also, a reference voltage generation unit 540 is provided that generates the reference voltage DVREF to provide to the cell power voltage discharging unit 530 with the reference voltage DVREF of a level different from the level of the reference voltage VREF.

The semiconductor memory device of FIG. 5 minimizes the unnecessary consumption of an current by temporarily raising and outputting the reference voltage DVREF, which is provided to the cell power voltage discharge unit 530 by the reference power voltage generation unit 540, at a level higher than the reference voltage VREF of the cell power voltage generation unit.

The basic operation and the over driving scheme of the core unit 510 of the present disclosed device are similar to those of the conventional method. That is, the data of a cell selected by word line are transferred to bit lines and the bit lines are diverged. Here the bit lines are diverged as much as the width ΔV. The width is determined by the ratio of the cell capacitance and the bit line capacitance and the size of the width goes from tens of millivolts to hundreds of millivolts. The sense amplifier is driven by this divergence and produces a value sufficient to read/write data. In the sense amplifier of the core unit 510, a first sense amplifier enable signal SA_EN_1 is inputted to the gate of a MOS transistor MOS1 during the over-driving period and the MOS transistor MOS1 is enabled. Then an external power voltage VEXT, which is higher than the cell power voltage CVDD, is supplied to the sense amplifier through the path A along the MOS transistor MOS1 and the restore line RTO shortly thereafter.

When the potential of the restore line RTO is raised to a predetermined level, the over driving finishes, and two methods are used to finalize the over driving. One method is to detect the potential of the restore line RTO. The other method is to perform the over driving for a predetermined time without detecting the potential of the restore line RTO. The latter method is used mostly for relatively stable processes.

After the over driving, the cell power voltage CVDD is supplied from the cell power voltage generation unit 520 to the core unit 510 during the first discharge. In this operation, the reference voltage generation unit 540 outputs a potential a little higher than the reference voltage VREF of the cell power voltage generation unit 520 to the cell power voltage discharge unit 530 so that it can be compared with the actual cell power voltage CVDD. After a predetermined time, the reference voltage generation unit 540 outputs the reference voltage DVREF at the same level as the reference voltage VREF in the second discharge period so that they can be compared to each other. Here, the internal circuit of the reference voltage generation unit 540 for the cell power voltage discharge unit operates as follows.

In the over-driving period and the second discharging period, the output voltage DVREF of the reference voltage generation unit 540 is made equal to the level of the reference voltage VREF of the cell power voltage generation unit 520 by supplying a low "L" state to the gate of the MOS transistor 541 as a control signal OVD_SW and thereby turning the MOS transistor 541 off. In the first discharging period, the output voltage DVREF of the reference voltage generation unit 540 is raised to have a higher potential than the reference voltage VREF of the cell power voltage generation unit 520 by supplying a high "H" state to the gate as a control signal for the MOS transistor 541 and thereby turning the MOS transistor on. In order to accomplish these different voltages, the resistance ratio between resistors R1, R2 and R3 used within the reference voltage generation unit 540 for the cell power voltage discharge unit needs to be appropriately set, as will be readily appreciated by those skilled in the art. It is preferable to select resistance valves such that the output voltage DVREF of the reference voltage generation unit 540 is 5 to 15% higher than the reference voltage VREF of the cell power voltage generation unit 520 in the first discharging period.

When performing the discharging operation mentioned above, a lesser undershoot phenomenon occurs, as illustrated in FIG. 6, in which the actual cell power voltage CVDD drops below the reference voltage VREF than in the prior art. Additionally, unnecessary consumption of a current by the repulsion caused between the cell power voltage generation unit 520 and the cell power voltage discharge unit 530 diminishes as well, which is favorable to semiconductor memory chips as their speed gets higher In one example, the first discharging period terminates when the cell power voltage, which is increased by the over driving of the core unit 510 and subsequently reduced by operation of the cell power voltage discharge unit 530, matches the same potential as the higher potential of DVREF (i.e., the second reference voltage) output by the reference voltage unit 540.

Figure 1:
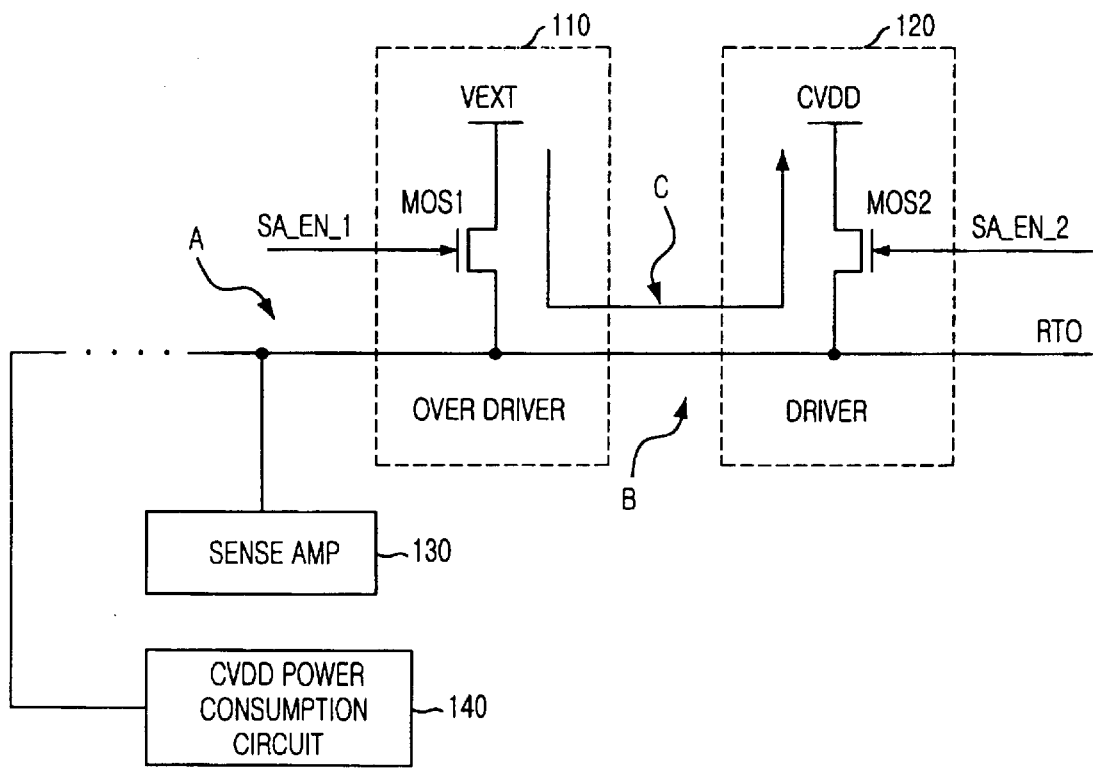
FIG. 1 is a block diagram illustrating a conventional over-driving scheme.
Figure 2:
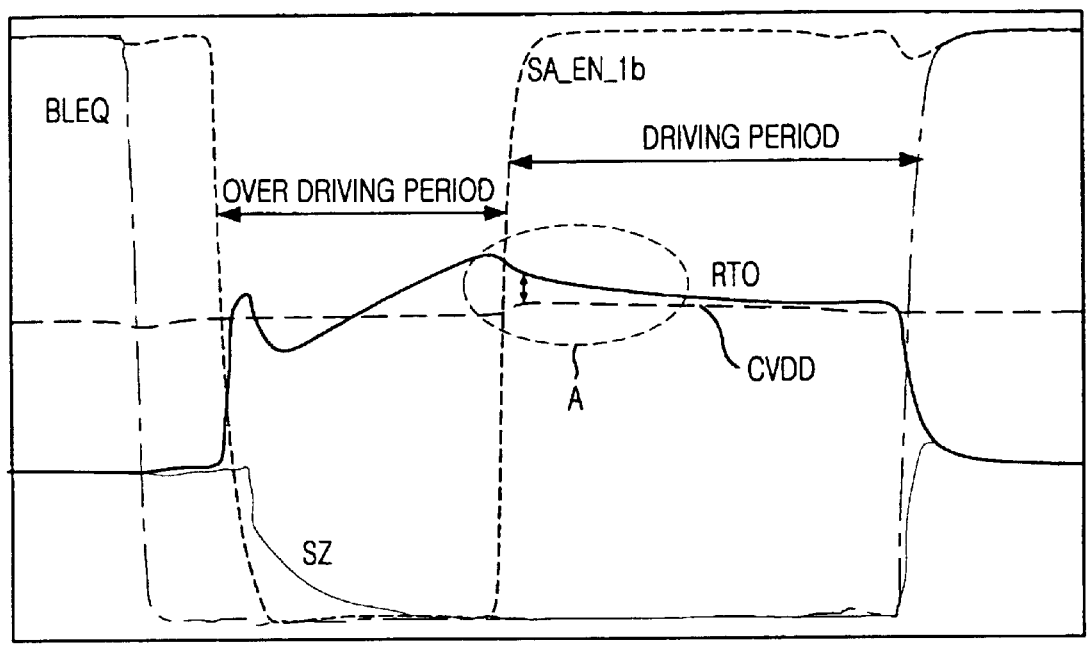
FIG. 2 is a waveform diagram of the over-driving scheme of FIG. 1.
Figure 3:
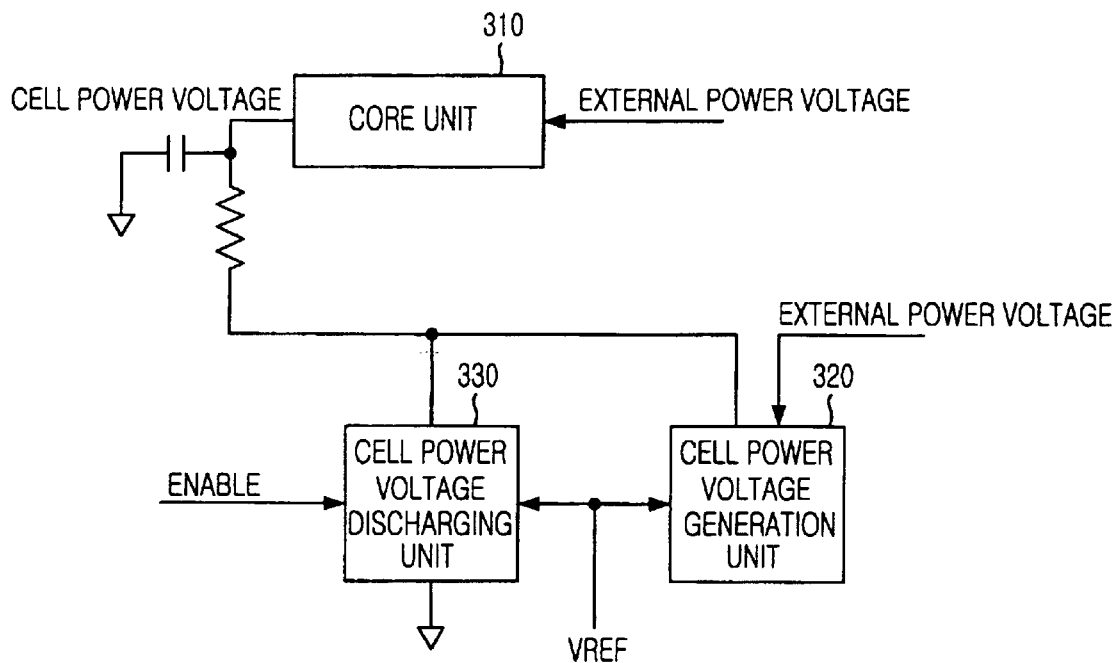
FIG. 3 is a block diagram illustrating the structure of a semiconductor memory device in accordance with another embodiment of the conventional over-driving method.
Figure 4:
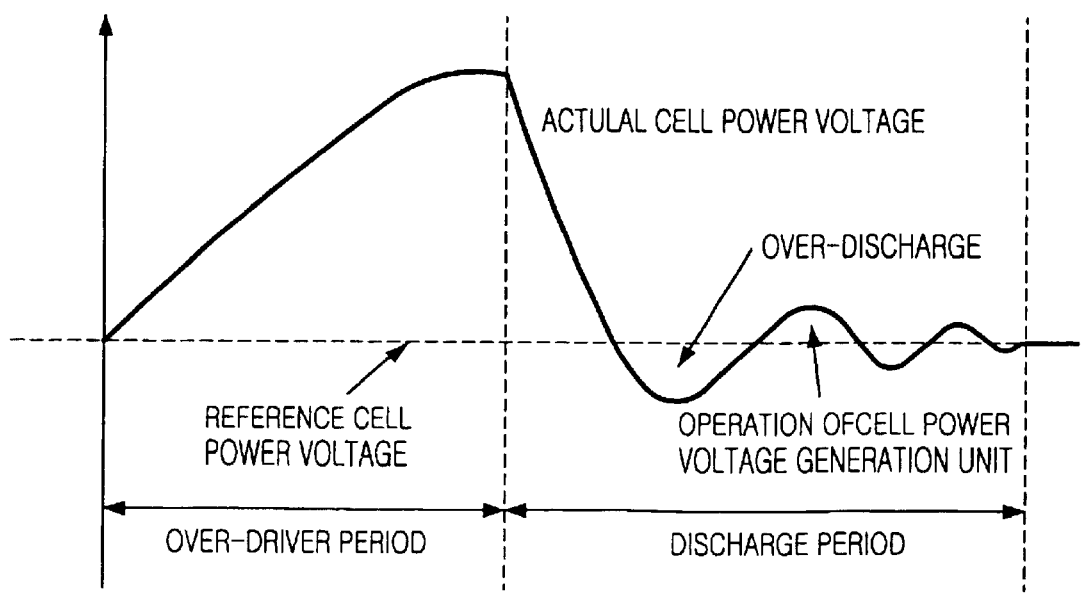
FIG. 4 is a waveform diagram of the semiconductor memory device of FIG. 3.
Figure 7:
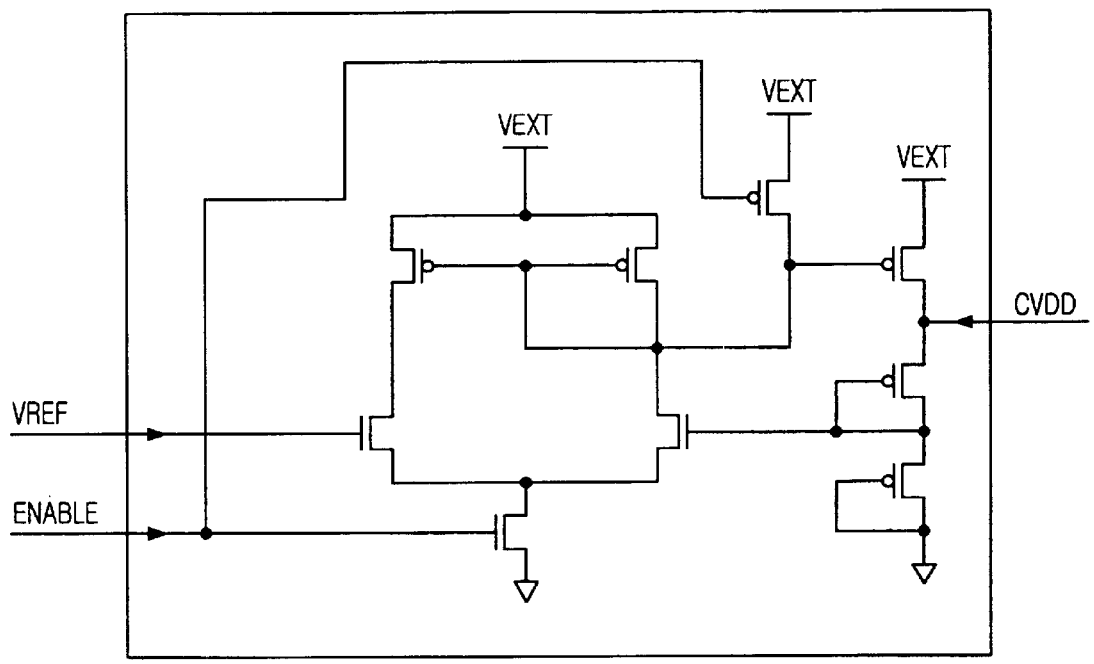
FIG. 7 is a circuit diagram of a cell power voltage generation unit used in FIGS. 3 and 5.
Figure 8:
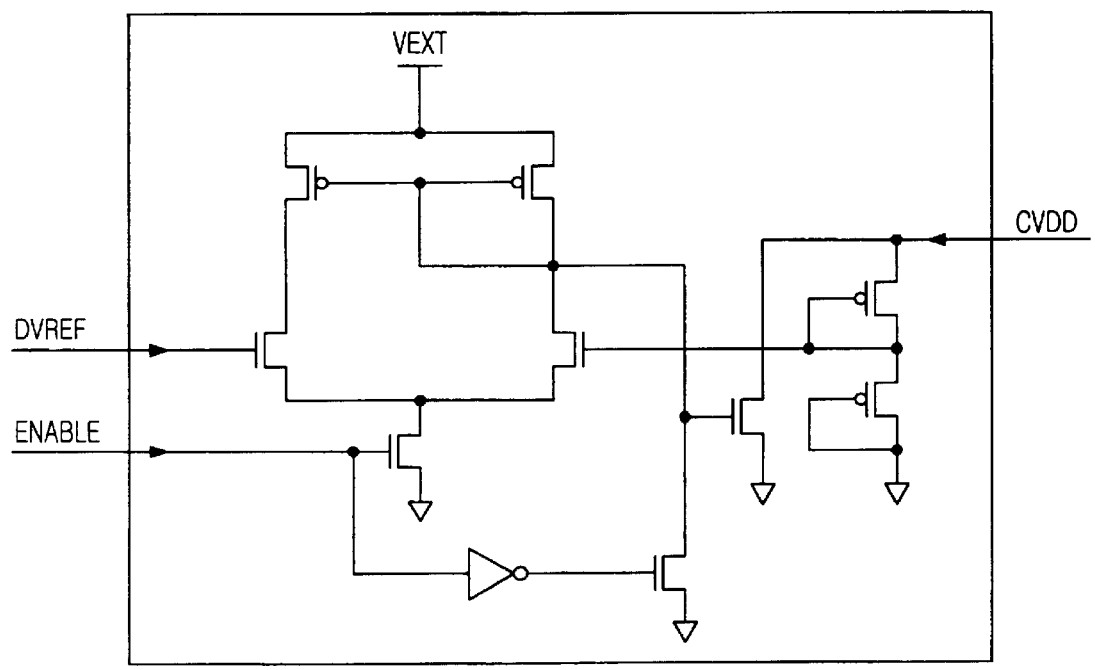
FIG. 8 is a circuit diagram of a cell power voltage discharge unit used in FIGS. 3 and 5.

FIG. 7 is a circuit diagram of a cell power voltage generation unit as is used in both the conventional circuit of FIG. 3 and the presently disclosed device of FIG. 5 and FIG. 8 is a circuit diagram of a cell power voltage discharge unit as is used in the devices shown in FIGS. 3 and 5, where VEXT denotes an external power voltage while VREF and DVREF stand for reference voltages of a cell power voltage generation unit and cell power voltage discharge unit, respectively. The enable signal ENABLE of the cell power voltage generation unit is a signal that is inputted as long as the sense amplifier operates, while the enable signal ENABLE of the cell power voltage discharge unit is a signal inputted during the first and the second discharging periods.

Figure 9:
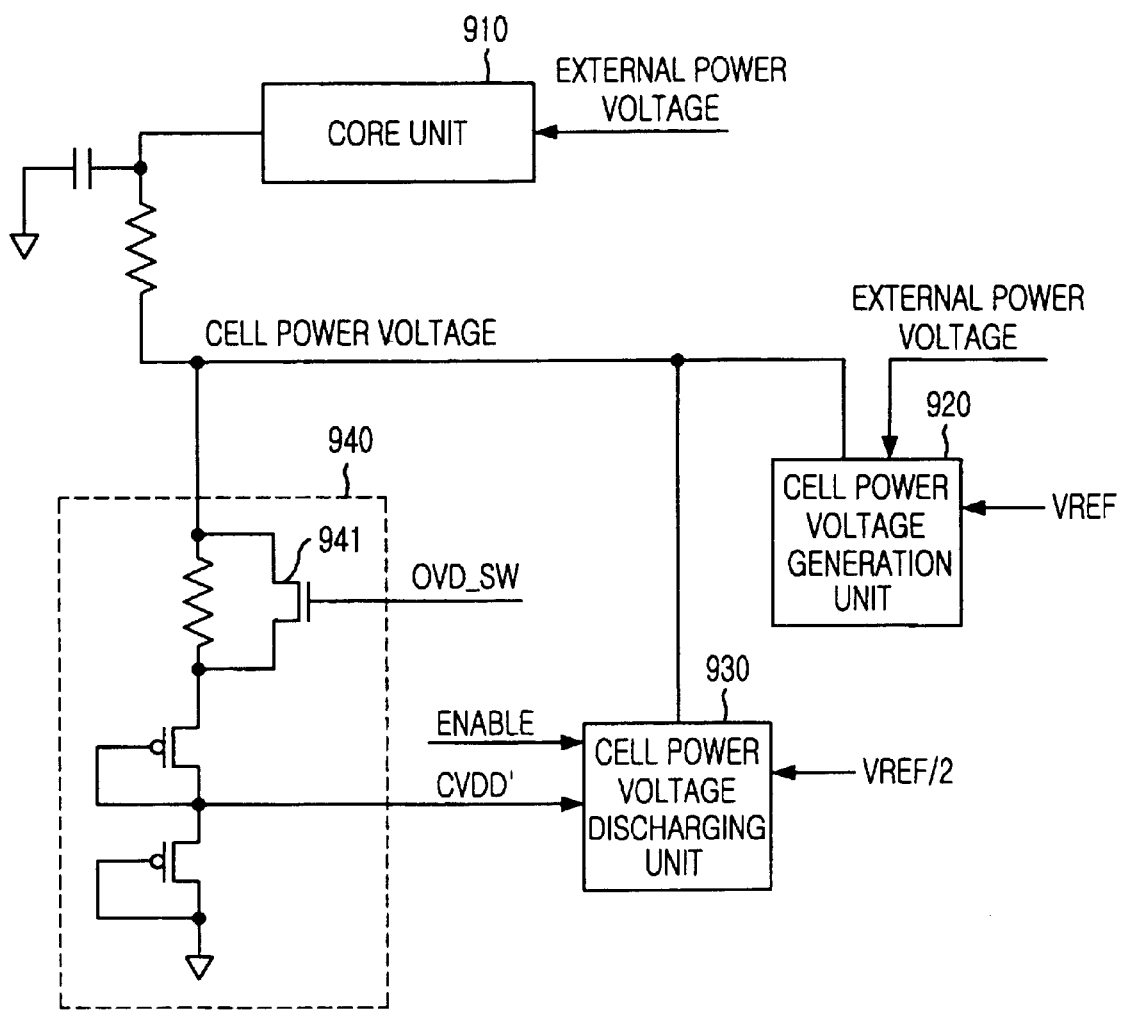
FIG. 9 is a block diagram illustrating the structure of the semiconductor memory device in accordance with another embodiment of the present disclosure.
Figure 10:
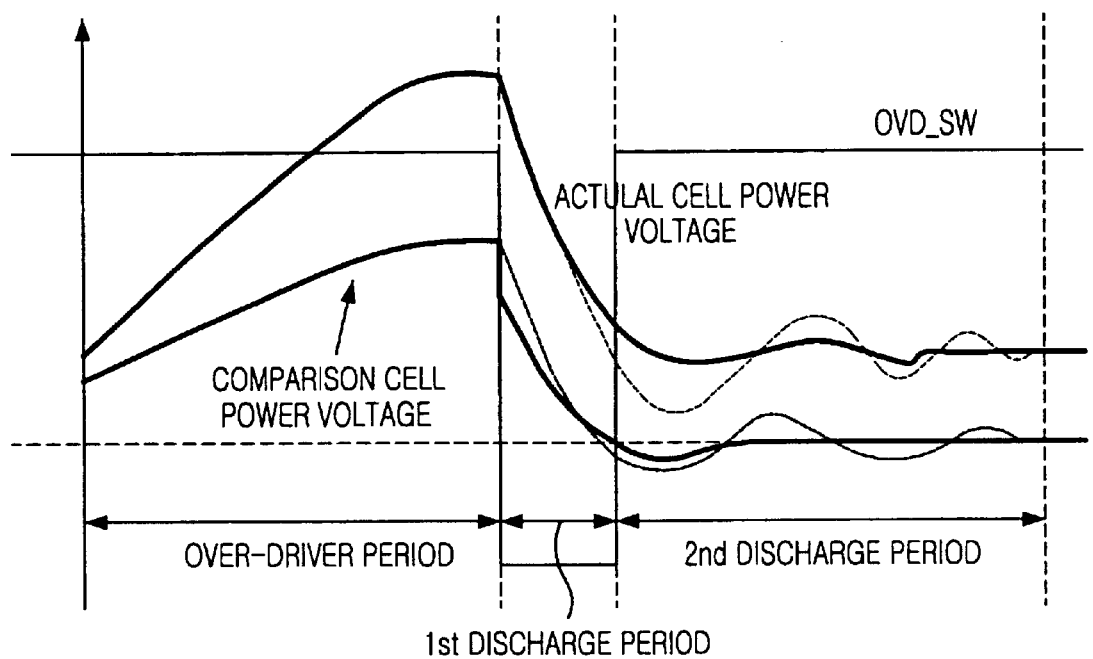
FIG. 10 is a waveform diagram of the semiconductor memory device over-driving of FIG. 9.

FIG. 9 is a block diagram illustrating the structure of the semiconductor memory device in accordance with another embodiment of the present disclosure and FIG. 10 is a waveform diagram of the over-driving of FIG. 9.

The disclosed embodiment of FIG. 9 does not make a separate reference voltage for the exclusive use of the cell power voltage discharge unit and minimizes unnecessary consumption of an electric current by controlling the cell power voltage CVDD inputted to the cell power voltage discharge unit. For this, the device includes a core unit 910 of a semiconductor memory chip using an external power voltage VEXT and the cell power voltage CVDD. A cell power voltage generation unit 920 generates a cell power voltage that is used as a power supply for the core unit 910. A cell power voltage discharge unit 930 lowers the level of the cell power voltage CVDD that has been raised by the operation of the core unit 910. Also, a comparative cell power voltage generation unit 940 provides a comparative cell power voltage CVDD' to the cell power voltage discharging unit 930 that is lower than a proportional cell power voltage that is in proportion to the cell power voltage by a predetermined voltage.

In the device shown in FIG. 5, the reference voltage VREF of the cell power voltage generation unit 520 and the reference voltage DVREF of the cell power voltage discharge unit in the over-driving period and the second discharge period are controlled with the same potential as that of the cell power voltage CVDD. However, here the reference voltage of the cell power voltage discharge unit uses VREF/2, making it a half of the cell power voltage CVDD.

The comparative cell power voltage generation unit 940 supplies a "H" state to the gate of the MOS transistor 941 as a control signal OVD_SW in the over-driving period and turns on the MOS transistor 941. At this moment, however, the discharge operation is not performed because the enable signal ENABLE is not supplied to the cell power voltage discharge unit 930. Once entering the first discharging period, a low "L" state is supplied to the gate of the MOS transistor 941 as a control signal OVD_SW along with the supply of the enable signal ENABLE to the cell power voltage discharge unit 930. The MOS transistor is turned off, causing the comparative cell power voltage CVDD' to decrease to a valve lower than half of the actual cell power voltage through the effect of the voltage drop across the resistance in parallel with the MOS transistor 941. Accordingly, when the MOS transistor 941 is turned on, the current that is consumed will be less than the amount of the current that flows in from the cell power voltage CVDD to the source voltage VSS. Therefore, the actual cell power voltage gets lowered excessively, thus reducing the undershoot effect.

Figure 11:
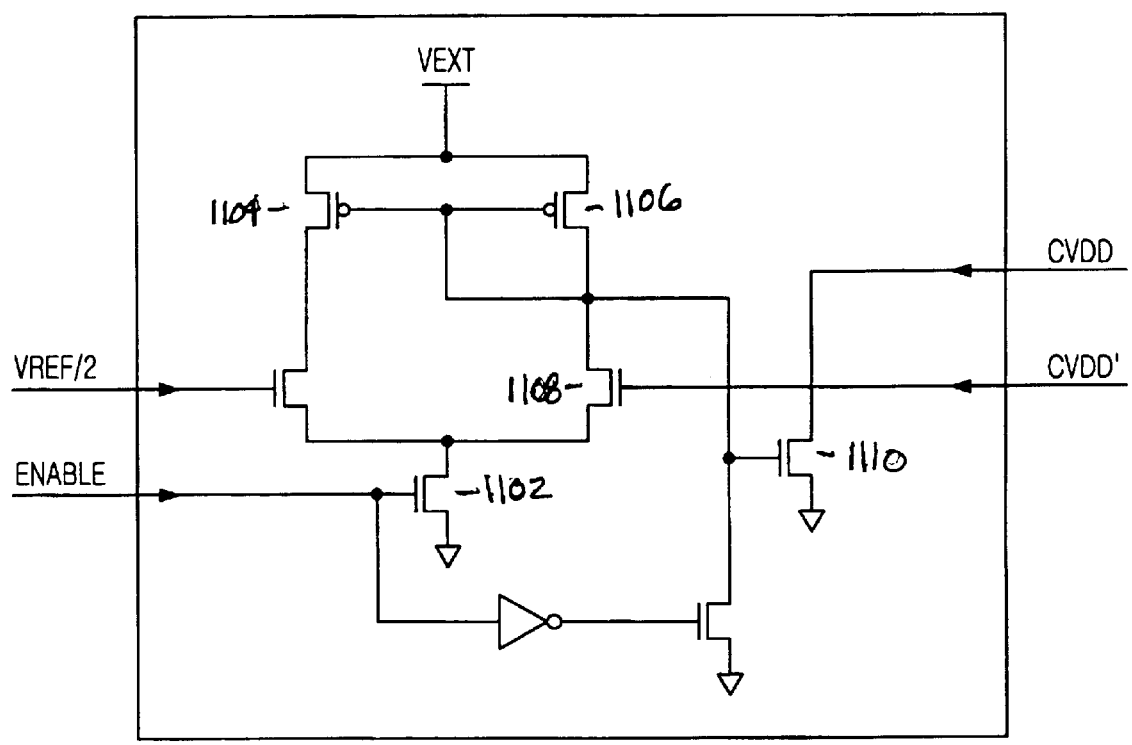
FIG. 11 is a circuit diagram illustrating a cell power voltage discharge unit used in FIG. 9.

FIG. 11 is a circuit diagram illustrating a cell power voltage discharge unit 930 used in FIG. 9, whose operation is to be briefly described hereinafter.

In the circuit of FIG. 11, the comparative cell power voltage CVDD' output from the comparative cell power voltage generation unit 940 (shown in FIG. 9) to the cell power voltage discharge unit 930 is compared with the potential of the reference voltage VREF/2. The enable signal ENABLE is enabled in a logic "high" level so that an NMOS transistor 1102 to which the ENABLE signal is applied is turned on. Since a potential of a node coupled to two PMOS transistors 1104, 1106, which are connected to VEXT and one of the transistors 1106 being also coupled to an NMOS transistor 1108 having CVDD' applied to its gate is decreased, the two PMOS transistors 1104, 1106 are turned on. Thus, VEXT is applied to a gate of another NMOS transistor 1110 to which CVDD is applied such that the NMOS transistor 1110 is turned on. Hence, the potential of CVDD is decreased because the NMOS transistor 1110 is coupled to ground potential, thereby discharging CVDD. Accordingly, if the potential of the comparative cell power voltage CVDD' is higher, the MOS transistor 941 (shown in FIG. 9), which is located between the cell power voltage terminal and the source voltage terminal, is turned on, thus lowering the potential of the cell power voltage CVDD provided by the operation of the core unit. In the case where the potential of the comparative cell power voltage CVDD' is lower, the MOS transistor 941 is turned off.

As described above, the present disclosed devices reduce unnecessary consumption of an electric current and shorten the time for stabilizing the cell power voltage to a normal state because the undershoot phenomenon of the cell power voltage drops remarkably.

While the teachings of the present apparatus and method have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A current reducing device in an over driver scheme of a semiconductor memory chip, comprising:

a core unit including a sense amplifier of the semiconductor memory chip;

a cell power voltage generation unit that is configured to use an external power voltage as a power source, wherein the cell power voltage generation unit is further configured to receive a cell power voltage, which is used as a power source for the core unit, and a first reference voltage and to increase the cell power voltage when the cell power voltage is lower than the first reference voltage;

a reference voltage generation unit configured to output a second reference voltage that is different from the first reference voltage during a portion of a discharging period; and a cell power voltage discharge unit configured to receive and compare the second reference voltage outputted from the reference voltage generation unit and the cell power voltage, and reduce the cell power voltage when the cell power voltage is higher than the second reference voltage.

2. A current reducing device as defined in claim 1, wherein the second reference voltage has a potential between 5 and 15 percent higher than the first reference voltage.

3. A current reducing device as recited in claim 1, wherein the discharging period comprises:

a first discharging period in which the cell power voltage discharge unit operates; and a second discharging period in which the cell power voltage discharge unit and the cell power voltage generation unit operate.

4. A current reducing device as defined in claim 3, wherein the first discharging period terminates when the cell power voltage, which is increased by the over driving of the core unit and subsequently reduced by operation of the cell power voltage discharge unit, matches the same potential as the potential of the second reference voltage.

5. A current reducing device as defined in claim 3, wherein the reference voltage outputted from the reference voltage generation unit for the cell power voltage discharge unit is the same potential as the first reference voltage during the second discharging period.

6. A current reducing device as defined in claim 3, wherein the first reference voltage is the same potential as the cell power voltage after the second discharging period due to the operation of the cell power voltage discharge unit and the cell power voltage generation unit.

7. A current reducing device as defined in claim 1, wherein the reference voltage generation unit includes:

a first resistance connected to an external power voltage;

second and third resistances arranged in a serial connection, wherein the serial connection of the second and third resistances is connected to the first resistance;

a transistor connected in parallel with the second resistance; and an output line connected between the second resistance and the third resistance.

8. A current reducing device as defined in claim 7, wherein the transistor is turned on during the first discharging period.

9. A current reducing device in an over driver scheme of a semiconductor memory chip, comprising:

a core unit including a sense amplifier of the semiconductor memory chip;

a cell power voltage generation unit that uses an external power voltage as a power source, the cell power voltage generation unit configured to receive a cell power voltage, which is used as a power source for the core unit, and a first reference voltage and increase the cell power voltage when the cell power voltage is lower than the first reference voltage;

a comparative cell power voltage generation unit for use by the cell power voltage discharge unit, the comparative cell power voltage generation unit configured to receive a second reference voltage, which is in proportion to the first reference voltage, and the cell power voltage, and to output a comparative cell power voltage that is lower than a proportional cell power voltage, which is in proportion to the cell power voltage, by a predetermined voltage during a portion of a discharging period; and a cell power voltage discharge unit configured to receive and compare the comparative cell power voltage and the second reference voltage during the discharging period, and reduce the cell power voltage when the comparative cell power voltage is higher than the second reference voltage.

10. A current reducing device as defined in claim 9, wherein a ratio of the first reference voltage to the second reference voltage is the same as a ratio of the cell power voltage to the comparative cell power voltage.

11. A current reducing device as defined in claim 9, wherein the discharging period includes:

a first discharging period in which the cell power voltage discharge unit operates; and a second discharging period in which the cell power voltage discharge unit and the cell power voltage generation unit operate.

12. A current reducing device as defined in claim 11, wherein the first discharging period terminates when the comparative cell power voltage equals the second reference voltage.

13. A current reducing device as defined in claim 11, wherein the comparative cell power voltage outputted from the comparative cell power voltage generation unit is equal to the second reference voltage during the second discharging period.

14. A current reducing device as defined in claim 9, wherein the comparative cell power voltage generation unit includes:

a resistance connected to the cell power voltage;

first and second transistors arranged in a serial connection, the serial connection of the first and second transistors, in turn, connected to the resistance;

a third transistor connected in parallel to the resistance; and an output line between the first and the second transistors.

15. A current reducing device as defined in claim 14, wherein the third transistor is turned off during the first discharging period.

16. A method for reducing an electric current in a sense amplifier over driver scheme of a semiconductor memory chip, comprising:

a) performing an over driving by an external power voltage;

b) generating a second reference voltage that is different from a first reference voltage inputted to a cell power voltage generation unit, which generates a cell power voltage during a portion of a discharging period;

c) comparing a cell power voltage increased by the over driving with the second reference voltage;

d) reducing the cell power voltage during the discharging period; and e) raising the cell power voltage when the cell power voltage is lower than the first reference voltage.

17. A method as defined in claim 16, wherein the second reference voltage has a potential between 5 and 15 percent higher than the first reference voltage.

18. A method as defined in claim 16, wherein the discharging period includes:

a first discharging period wherein the cell power voltage is reduced; and a second discharging period wherein the cell power voltage is alternately increased and decreased.

19. A method as defined in claim 18, wherein the first discharging period terminates when the cell power voltage, which has been raised by the over driving, reduces to the same potential as the second reference voltage.

20. A method as defined in claim 18, wherein the potential of the cell power voltage equals the first reference voltage during the second discharging period.

21. A method for reducing an electric current in a sense amplifier over driver scheme of a semiconductor memory chip, comprising:

a) performing an over driving with an external power voltage;

b) outputting a comparative power voltage that is lower than a proportional cell power voltage, which is in proportion with a cell power voltage, during a portion of a discharging period by a predetermined voltage;

c) comparing the comparative cell power voltage with a first reference voltage and reducing the cell power voltage, which has been raised by the over driving; and d) raising the cell power voltage when the cell power voltage is lower than a second reference voltage that is in proportion to the first reference voltage.

22. A method as defined in claim 21, wherein a ratio of the first reference voltage to the second reference voltage is equal to a ratio of the comparative cell power voltage to the cell power voltage.

23. A method as defined in claim 21, wherein the discharging period includes:

a first discharging period during which the cell power voltage is lowered; and a second discharging period during which the cell power voltage is alternately increased and decreased.

24. A method as defined in claim 23, wherein the first discharging period terminates when the comparative cell power voltage equals the first reference voltage.

25. A method as defined in claim 23, wherein the comparative cell power voltage equals the first reference voltage during the second discharging period.

* * * * *